(12) United States Patent
Chen et al.

(10) Patent No.: US 7,795,959 B2
(45) Date of Patent: Sep. 14, 2010

(54) SWITCHED-CAPACITOR CIRCUIT HAVING SWITCH-LESS FEEDBACK PATH

(75) Inventors: Iliana Fujimori Chen, Somerville, MA (US); Christopher W. Mangelsdorf, Tokyo (JP)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/194,982

(22) Filed: Aug. 20, 2008

(65) Prior Publication Data

US 2009/0195306 A1     Aug. 6, 2009

Related U.S. Application Data

(60) Provisional application No. 61/063,220, filed on Feb. 1, 2008.

(51) Int. Cl.
    *H03F 1/02*      (2006.01)
(52) U.S. Cl. ............................. 330/9; 330/310
(58) Field of Classification Search .............. 330/9, 330/51, 98–100, 310; 327/124, 307, 554
See application file for complete search history.

(56) References Cited

U.S. PATENT DOCUMENTS

| 5,745,002 | A | * | 4/1998 | Baschirotto et al. | 327/554 |
| 6,891,439 | B2 | * | 5/2005 | Jaehne et al. | 330/296 |
| 7,142,036 | B2 | * | 11/2006 | Ranganathan | 327/337 |
| 7,365,597 | B2 | * | 4/2008 | Forbes | 330/9 |

OTHER PUBLICATIONS

R. Gregorian, High-resolution Switched-Capacitor D/A Converter, Microelectronics J., vol. 12, No. 2, pp. 10-13, Mar./Apr. 1981.
J. Crols and M. Steyaert, "Switched-Opamp: An Approach to Realize Full CMOS Switched-Capacitor Circuits at Very Low Power Supply Voltages," IEEE Journal of Solid-State Circuits, vol. 29, No. 8, pp. 936-942, Aug. 1994.

* cited by examiner

*Primary Examiner*—Robert Pascal
*Assistant Examiner*—Hieu P Nguyen
(74) *Attorney, Agent, or Firm*—Kenyon & Kenyon LLP

(57) ABSTRACT

A switched-capacitor circuit includes a plurality of cascaded differential-input, single-ended-output amplifiers. A negative feedback path, from an output terminal of a last of the cascaded amplifiers to an input terminal of a first of the cascaded amplifiers, is configured to exclude, and not be shorted out by, any switches.

19 Claims, 14 Drawing Sheets

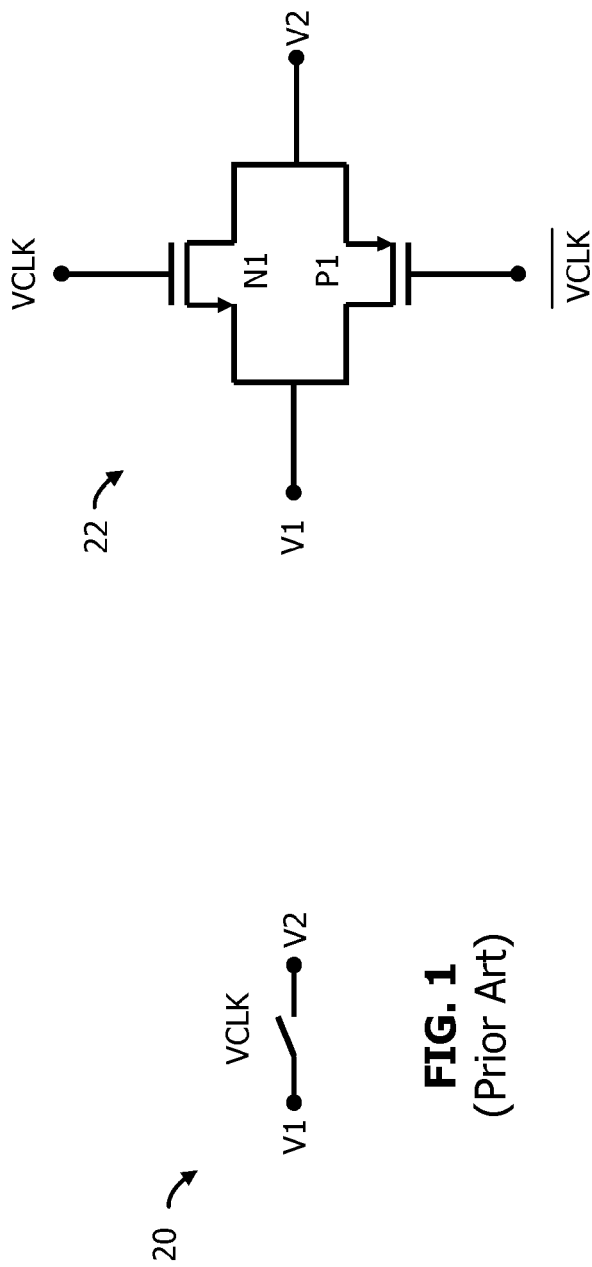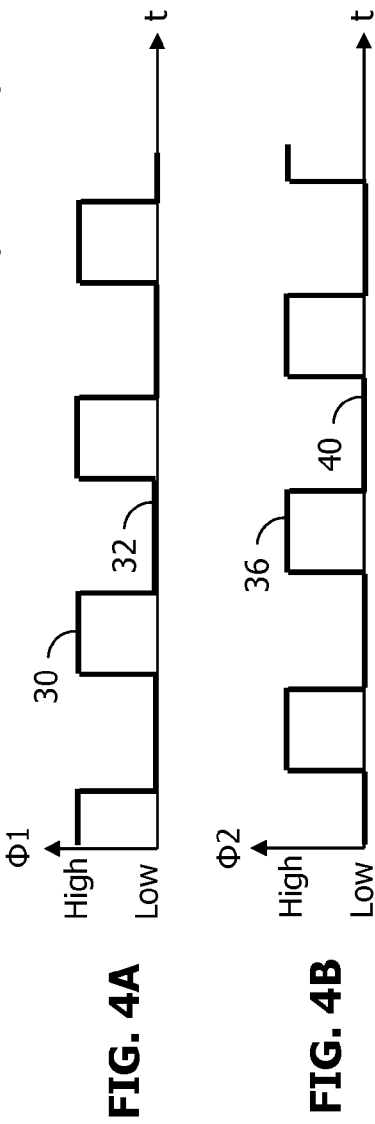

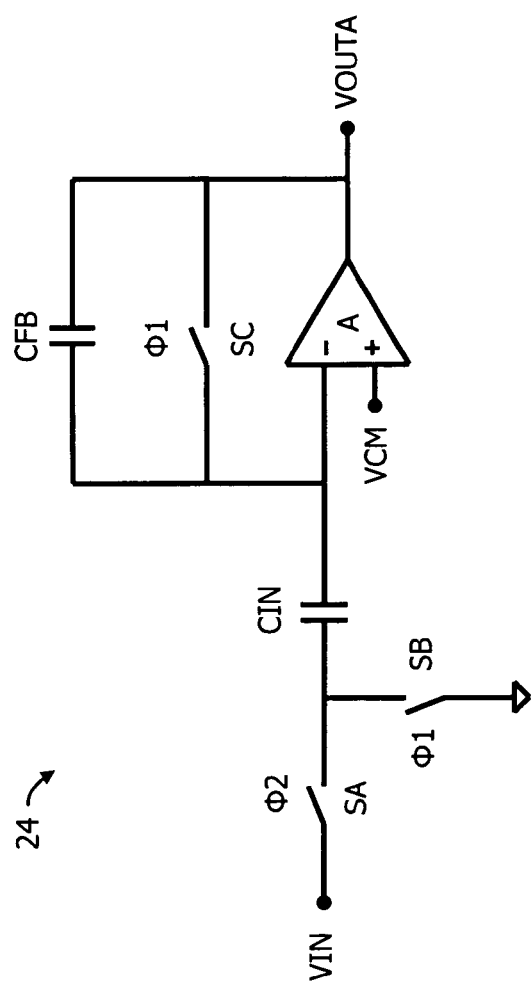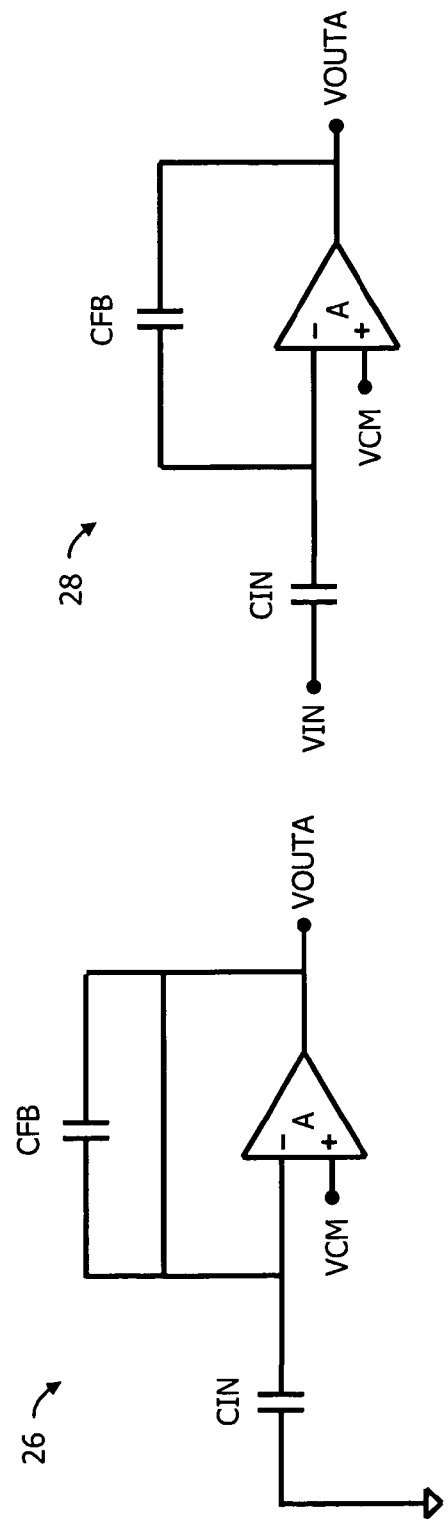
FIG. 3
FIG. 5A
FIG. 5B

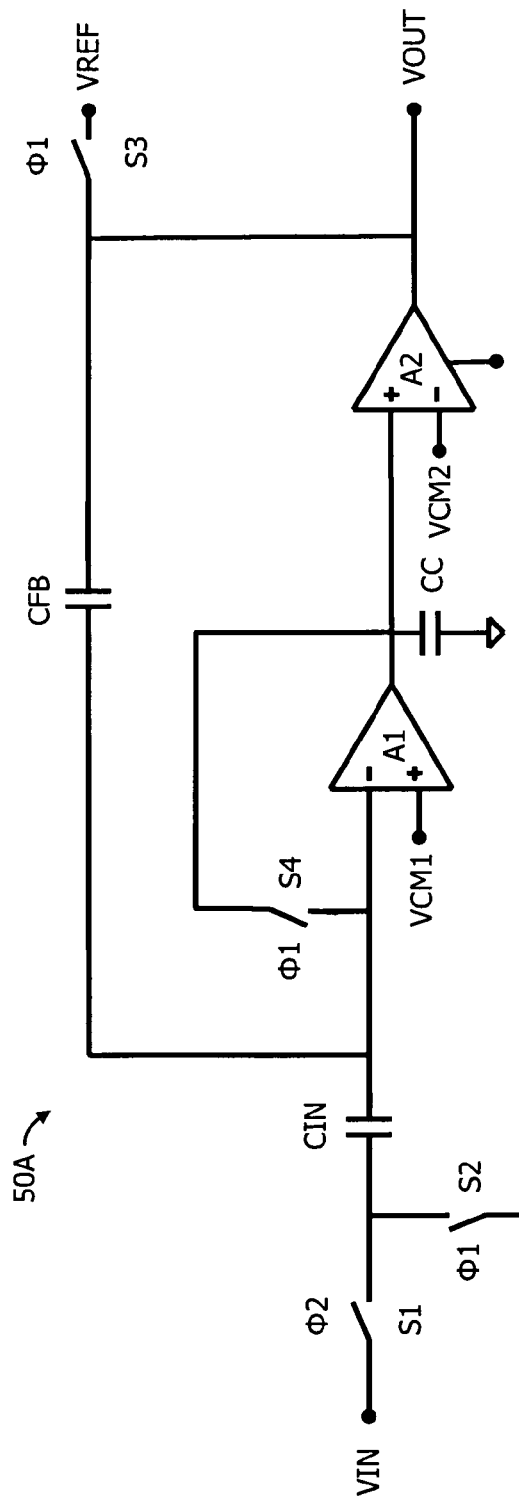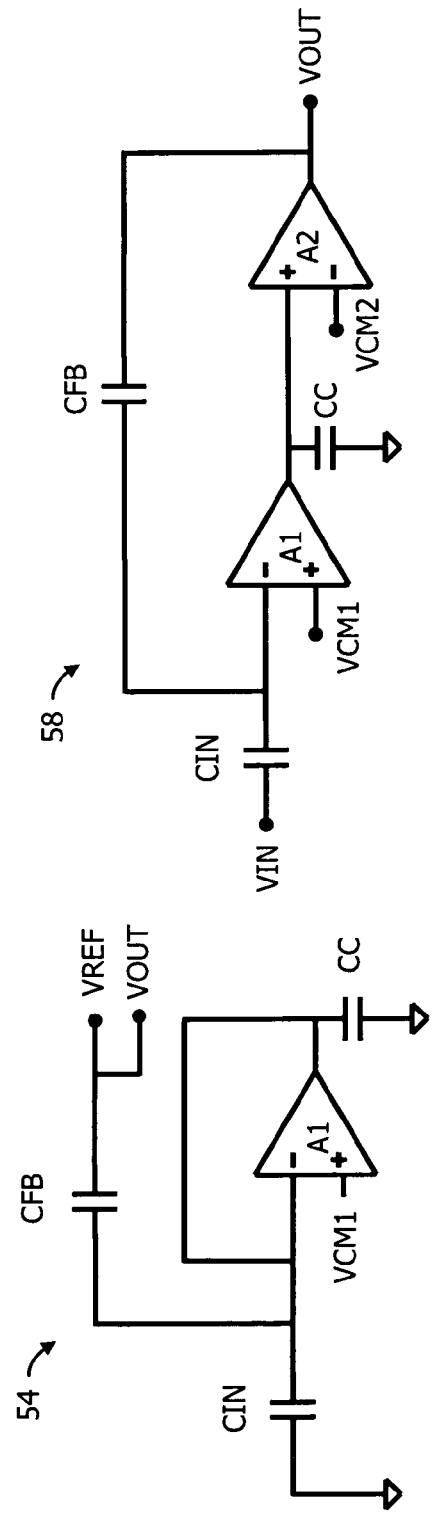
FIG. 8
FIG. 9A
FIG. 9B

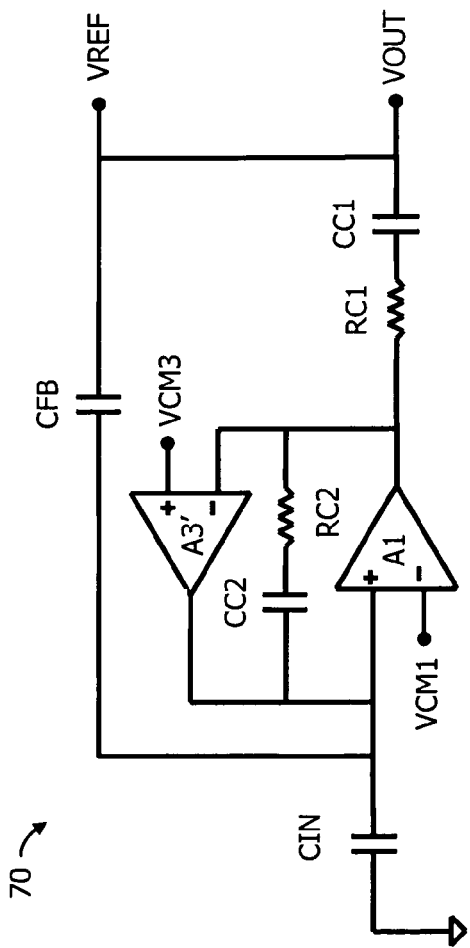
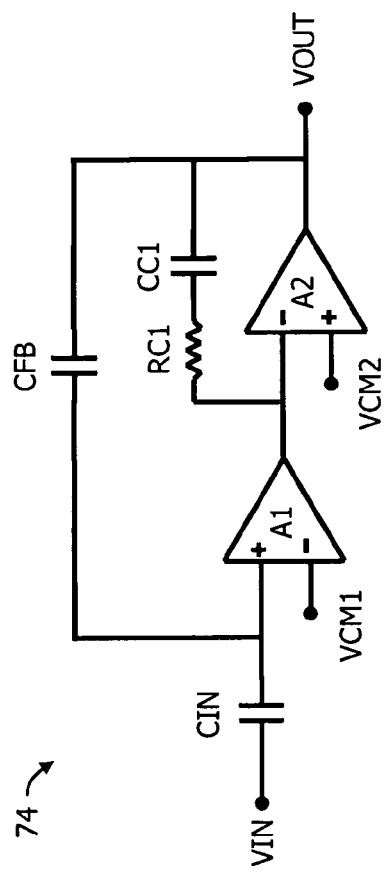
FIG. 13A
FIG. 13B

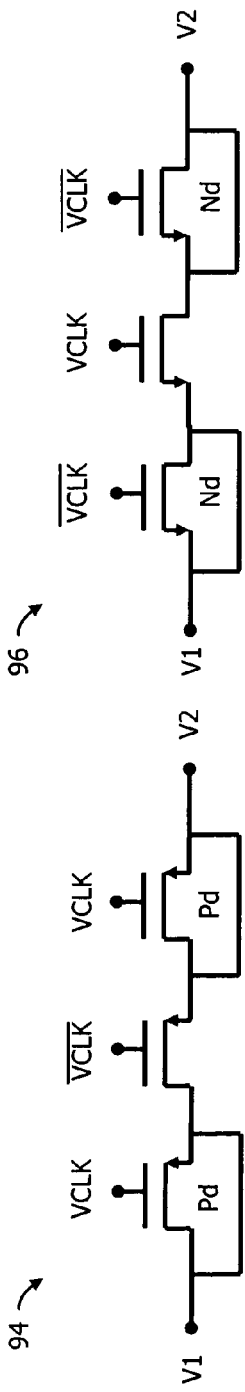
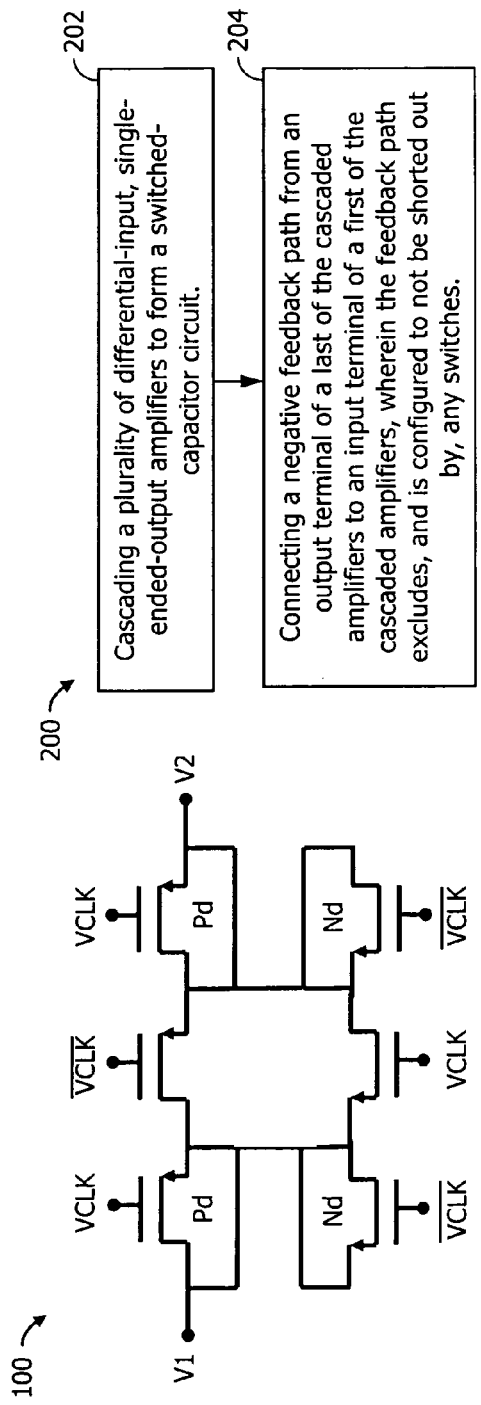
FIG. 20A
FIG. 20B
FIG. 20C
FIG. 22

US 7,795,959 B2

SWITCHED-CAPACITOR CIRCUIT HAVING SWITCH-LESS FEEDBACK PATH

CROSS-REFERENCE TO RELATED APPLICATIONS

This application claims priority to U.S. Provisional Patent Application No. 61/063,220, to Iliana Fujimori Chen and Christopher W. Mangelsdorf, filed on Feb. 1, 2008, entitled "Switched-Capacitor Circuit with Switch-less Feedback Path," which is herein incorporated by reference in its entirety.

BACKGROUND INFORMATION

Switched-capacitor circuits typically include switches, along with amplifiers, in arrangements configured to implement specific input-to-output transfer functions. For example, switched-capacitor circuits can be used to implement gain stages, filters, D/A converters, and many other types of circuits. The switches of switched-capacitor circuits are selectively switched on and off by clock signals to realize the transfer functions.

FIG. 1 depicts an exemplary switch 20 that could be used in a switched-capacitor circuit. The switch 20 includes a first terminal associated with a first voltage V1, a second terminal associated with a second voltage V2, and a switching terminal configured to receive a clock signal VCLK. In an enabled state, the switch 20 is closed and connects the first terminal to the second terminal. In a disabled state, the switch 20 is open and the first and second terminals are isolated from each other. The switch 20 is enabled and disabled according to the clock signal VCLK received at the switching terminal.

Switches suitable for use in switched-capacitor circuits, such as the switch 20 depicted in FIG. 1, can be implemented by arrangements of transistors operated in a switching mode. FIG. 2 shows an exemplary transistor implementation 22 of the switch 20 depicted in FIG. 1. The exemplary transistor implementation 22 includes an NMOS transistor N1 and a PMOS transistor P1, arranged in parallel, with the source of the NMOS transistor N1 and the drain of the PMOS transistor P1 connected together, the drain of the NMOS transistor N1 and the source of the PMOS transistor P1 connected together, and gates of the NMOS and PMOS transistors N1, P1 configured to receive the clock signal VCLK its inverse $\overline{VCLK}$, respectively. When the clock signal VCLK has a logic-high value, the switch embodiment 22 of FIG. 2 is enabled, and both the NMOS and PMOS transistors N1, P1 are turned on. When the clock signal VCLK has a logic-low value, the switch 22 is disabled, and both the NMOS and PMOS transistors N1, P1 are turned off.

One problem, however, with the transistor implementation 22 of FIG. 2, and with other transistor implementations of the switch 20, is that they typically implement non-ideal switches. Generally speaking, an ideal switch presents zero impedance between its first and second terminals when enabled, and infinite impedance between these terminals when disabled. However, the transistor implementation 22 of FIG. 2, and also other transistor implementations, typically presents, among other non-ideal characteristics, a non-zero resistance between the first and second terminals when enabled. This is due to, e.g., a non-zero impedance of the conduction channel formed between the sources and drains of the NMOS and PMOS transistors N1, P1 of FIG. 2 when turned on.

Non-ideal switches can in turn impact the performance of switched-capacitor circuits containing such switches. A switched-capacitor circuit, which includes the transistor switch embodiment 22 of FIG. 2, or other non-ideal switch embodiments, in a signal path, may suffer from adverse effects of the non-zero impedance in the enabled state. For example, this non-zero impedance may adversely affect a frequency response of the switched-capacitor circuit.

BRIEF DESCRIPTION OF THE DRAWINGS

So that features of the present invention can be understood, a number of drawings are described below. It is to be noted, however, that the appended drawings illustrate only particular embodiments of the invention and are therefore not to be considered limiting of its scope, for the invention may encompass other equally effective embodiments.

FIG. 1 is a circuit schematic depicting an embodiment of a switch.

FIG. 2 is a circuit schematic depicting an embodiment of a transistor implementation of the switch depicted in FIG. 1.

FIG. 3 is a circuit schematic depicting an embodiment of a first switched-capacitor circuit.

FIG. 4A depicts an embodiment of a first clock signal.

FIG. 4B depicts an embodiment of a second clock signal having an enable phase that does not overlap an enable phase of the first clock signal depicted in FIG. 4A.

FIG. 5A is a circuit schematic depicting an embodiment of a circuit configuration resulting from the first circuit depicted in FIG. 3 during the enable phase of the first clock signal.

FIG. 5B is a circuit schematic depicting an embodiment of a circuit configuration resulting from the first switched-capacitor circuit depicted in FIG. 3 during the enable phase of the second clock signal.

FIG. 8 is a circuit schematic depicting an embodiment of a third switched-capacitor circuit.

FIG. 9A is a circuit schematic depicting an embodiment of a circuit configuration resulting from the embodiment of the third switched-capacitor circuit depicted in FIG. 8 during the enable phase of the first clock signal.

FIG. 9B is a circuit schematic depicting an embodiment of a circuit configuration resulting from the embodiment of the third switched-capacitor circuit depicted in FIG. 8 during the enable phase of the second clock signal.

FIG. 13A is a circuit schematic depicting an embodiment of a circuit configuration resulting from the embodiment of the third switched-capacitor circuit depicted in FIG. 12 during the enable phase of the first clock signal.

FIG. 13B is a circuit schematic depicting an embodiment of a circuit configuration resulting from the embodiment of the third switched-capacitor circuit depicted in FIG. 12 during the enable phase of the second clock signal.

FIG. 20A is a circuit schematic depicting another embodiment of a transistor switch implementation, having PMOS transistors.

FIG. 20B is a circuit schematic depicting another embodiment of a transistor switch implementation, having NMOS transistors.

FIG. 20C is a circuit schematic depicting another embodiment of a transistor switch implementation, having NMOS and PMOS transistors.

FIG. 22 is a flow chart depicting an embodiment of a method.

DETAILED DESCRIPTION OF EXAMPLE EMBODIMENTS

Figure 6:
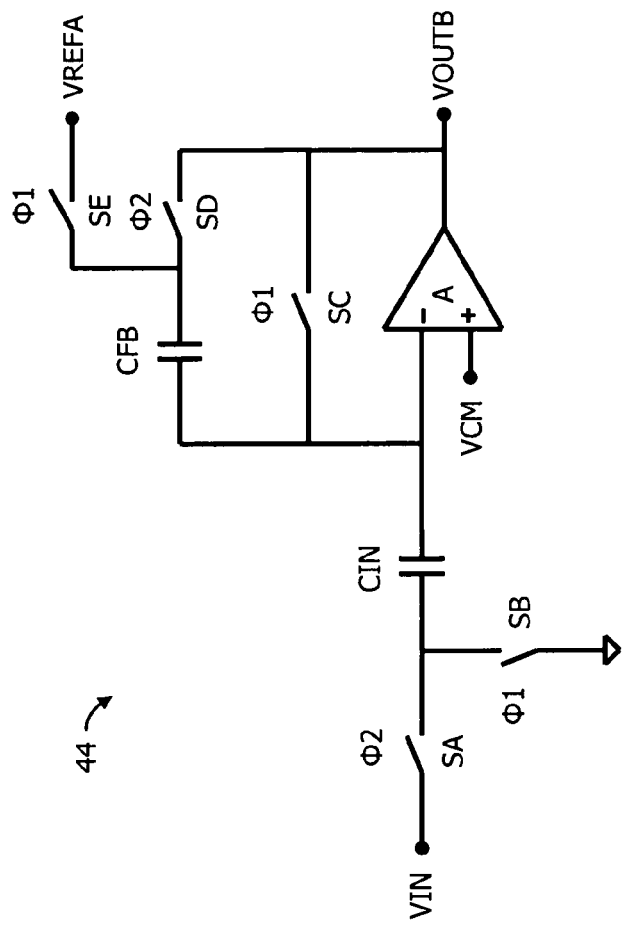
FIG. 6 is a circuit schematic depicting an embodiment of a second switched-capacitor circuit.

FIG. 3 depicts an embodiment of a first switched-capacitor circuit 24 that can be used to implement a gain stage, among other potential functionalities. The first switched-capacitor circuit 24 includes first and second input switches SA, SB, an input capacitor CIN, a feedback capacitor CFB, a feedback switch SC, and an amplifier A having differential input terminals and a single output terminal. The input capacitor CIN is connected between the first and second input switches SA, SB and an inverting input terminal of the amplifier A. The feedback capacitor CFB and feedback switch SC are connected between the output terminal of the amplifier A, which is also connected to an output node (having an output voltage VOUTA) of the first switched-capacitor circuit 24, and the inverting input terminal. The first and second input switches SA, SB are connected between the inverting input of the amplifier A and an input node of the switched-capacitor circuit 24 configured to receive an input voltage VIN, and ground, respectively. The second input switch SB and the feedback switch SC are configured to receive a first clock signal $\phi 1$, and the first input switch SA is configured to receive a second clock signal $\phi 2$. A non-inverting input of the amplifier A is configured to receive a common-mode voltage VCM.

The first and second clock signals $\phi 1$, $\phi 2$ are non-overlapping clock signals. FIGS. 4A and 4B depict exemplary embodiments of the first and second non-overlapping clock signals $\phi 1$, $\phi 2$ that can be used to switch the first switched-capacitor circuit 24, as well as other switched-capacitor circuits discussed herein. The first clock signal $\phi 1$ has a logic-high enable phase 30 and a logic-low non-enable phase 32. The second clock signal $\phi 2$ also has a logic-high enable phase 36 and a logic-low non-enable phase 40. The enable phases 30, 36 of the first and second clock signals $\phi 1$, $\phi 2$ are non-overlapping, i.e., temporally mutually-exclusive. A switch configured to receive a particular one of the first and second clock signals $\phi 1$, $\phi 2$ at its switching terminal is switched on, i.e., enabled, during the enable phase of the particular clock signal, and switched off, i.e., disabled, during the non-enable phase of the particular clock signal.

In some switched-capacitor circuits, an overall output of the circuit is considered to be valid during the enable phase of a particular one of the first and second clock signals $\phi 1$, $\phi 2$. For example, the switched-capacitor circuits discussed herein can be operated in a mode in which the overall outputs of the circuits are considered to be valid during the enable phase 36 of the second clock signal $\phi 2$, and considered to be not yet validly-available during the enable phase 30 of the first clock signal $\phi 1$.

Note that the depicted first and second clocking signals $\phi 1$, $\phi 2$ are identical to each other except for being 180° out of phase. Thus, assignment of first and second clocking signals $\phi 1$, $\phi 2$ to switching terminals of particular switches in the switched-capacitor circuits discussed herein can be reversed, so long grouping of particular switches to common switching signals is maintained. Also, although the transistor switch embodiment 22 of FIG. 2 is configured to be enabled by a logic-high value received at its switching terminal, other transistor embodiments of the switch 20 of FIG. 1 can be configured to instead be enabled by a logic-low value received at its switching terminal.

FIG. 5A depicts a circuit configuration 26, assuming ideal switches, resulting from the first switched-capacitor circuit 24 of FIG. 3 during the enable phase 30 of the first clocking signal $\phi 1$. Note that feedback switch SC shorts out the feedback capacitor CFB during the enable phase 30 of the first clock signal $\phi 1$. FIG. 5B depicts a circuit configuration 28, assuming ideal switches, resulting from the first switched-capacitor circuit 24 of FIG. 3 during the enable phase 36 of the second clocking signal $\phi 2$. An input-to-output transfer function of the first switched-capacitor circuit 24 can be derived using a discrete-time charge-conservation analysis, and can be represented by the following: VOUTA=VCM+VOFF−(CIN/CFB)*VIN; where VOFF is an input-referred offset voltage VOFF appearing between the inverting and non-inverting input terminals of the amplifier A as a result of non-idealities of the amplifier A.

An ideal differential-to-single-ended amplifier implements a transfer function represented by VOA=(VIA±VIA−)*GA, where VOA is the voltage produced at the output terminal, VIA+ and VIA− are voltages received at the non-inverting and inverting input terminals, respectively, and GA is the gain of the amplifier. The ideal version of the amplifier would therefore produce a zero value of the output voltage VOA in response to a zero value of the differential input voltage, VIA±VIA−. However, as a practical reality, most amplifiers have small imperfections such as, e.g., slightly differently-sized transistors on either side of a differential signal path, that imbalance the operation of the amplifier to one side or other of the differential signal path, resulting in a non-zero value of the differential input voltage (VIA±VIA−) being required to produce a zero value of the output voltage VOA. This non-zero differential input voltage value is known as the offset voltage VOFF, or the input-referred offset voltage VOFF, of the amplifier, and can manifest itself as the voltage difference between the input terminals of the amplifier when it is configured to operate in a negative feedback loop.

One characteristic of the first switched-capacitor circuit 24 depicted in FIG. 3 is that the output voltage VOUTA is a function of the input-referred offset voltage VOFF of the amplifier A, which can be regarded as a non-ideal DC error in the output voltage VOUTA. Another characteristic of this first switched-capacitor circuit 24, is that the DC offset of the output voltage VOUTA includes the common-mode voltage VCM appearing at the non-inverting input of the amplifier A, which effectively limits the degree of variability of the transfer function that can be implemented by the first switched-capacitor circuit 24 of FIG. 3.

FIG. 6 depicts an embodiment of a second switched-capacitor circuit 44. The second switched-capacitor circuit 44 includes the first, second and third switches SA, SB, SC, the input and feedback capacitors CIN, CFB, and the differential-to-single-ended amplifier A discussed above in regard to the first switched-capacitor circuit 24 of FIG. 3. Differences between the second switched-capacitor circuit 44 and the first switched-capacitor circuit 24 include that a fourth switch SD is connected from the output terminal of the amplifier A to a terminal of the feedback capacitor CFB, and is enabled during the enable phase 36 of the second clock signal φ2. Also, a fifth switch SE is connected between the same terminal of the feedback capacitor CFB and a circuit node configured to receive a reference voltage VREFA, and is enabled during the enable phase 30 of the first clock signal φ1. The fourth switch SD is located in a feedback path from the output terminal of the amplifier A to its inverting input terminal. The reference voltage VREFA can be a selected DC voltage.

Figure 7:
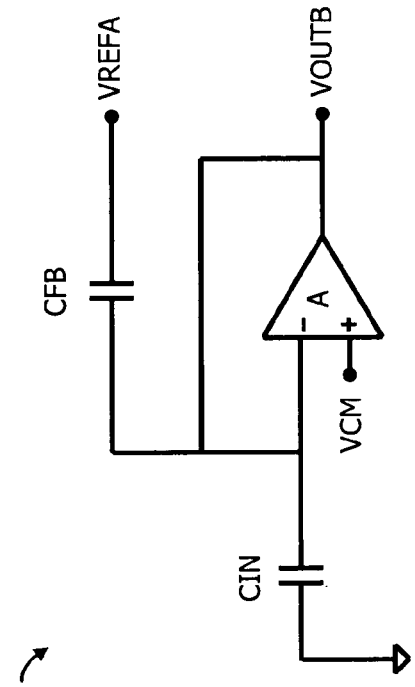
FIG. 7 is a circuit schematic depicting an embodiment of a circuit configuration resulting from the second switched-capacitor circuit depicted in FIG. 6 during the enable phase of the first clock signal.

FIG. 7 depicts a circuit configuration 46, assuming ideal switches, resulting from the second switched-capacitor circuit 44 of FIG. 6 during the enable phase 30 of the first clock signal φ1. During the enable phase 36 of the second clock signal φ2, the second switched-capacitor circuit 44 of FIG. 6 again results in the circuit configuration 28 of FIG. 5B. An input-to-output transfer function of the second switched-capacitor circuit 44 depicted in FIG. 6 can be derived using a discrete-time charge-conservation analysis, and can be represented by the following: VOUTB=VREFA−(CIN/CFB)*VIN; where VOUTB is the output voltage VOUTB produced at an overall output terminal of the second switched capacitor circuit 44.

One characteristic of the transfer function of the second switched-capacitor circuit 44 of FIG. 6 is that, unlike with the transfer function discussed in regard to the first switched-capacitor circuit 24, the offset voltage VOFF of the amplifier A is no longer reflected in the output voltage VOUTB. An additional characteristic of this transfer function, relative to that of the first switched-capacitor circuit 24, is that the DC offset of the output voltage VOUTB can now be set by selecting the reference voltage VREFA. Selection of a value for the reference voltage VREFA does not affect the operation of the amplifier A, as would be the case with adjusting the value of the common-mode voltage VCM received at the non-inverting input terminal of the amplifier A in the first switched-capacitor circuit 24.

However, an additional characteristic of the second switched-capacitor circuit 44 depicted in FIG. 6 is that it contains the fourth switch SD in the feedback path from the output terminal of the amplifier A to its inverting input terminal. The fourth switch SD is connected from the output terminal of the amplifier A to a terminal of the feedback capacitor CFB, and is enabled during the enable phase 36 of the second clock signal φ2. The fourth switch SD, in practical reality, will be a non-ideal switch, e.g., when implemented by transistors, and will thus present a non-zero channel resistance in this feedback path during the enable phase 36 of the second clock signal φ2, which is also when the overall output voltage VOUTB of the second switched-capacitor circuit 44, and other switched-capacitor circuits discussed herein, can typically be considered valid. This non-zero channel resistance present in this feedback path will tend to adversely affect the frequency response of the input-to-output transfer function of the second switched-capacitor circuit 44. Furthermore, it can be difficult to mitigate the effect of this non-zero channel resistance. For example, if channel widths of transistors of implementations of the fourth switch SD are increased, to potentially reduce this non-ideal channel resistance, a parasitic capacitance associated with these same transistors is likely to be correspondingly increased, which can also adversely affect the frequency response, thus offsetting any benefits of the reduced channel resistance. Likewise, if the channel widths are reduced to reduce the associated parasitic capacitance, the channel resistance is likely to increase. Moreover, depending on the desired output voltage, the fourth switch SD may need to be a high-voltage switch, which typically presents an even larger non-ideal channel resistance than a relatively lower-voltage switch, exacerbating the adverse effects on the frequency response. These undesirable effects may be particularly troublesome in high- and ultra-low-voltage applications, where the tradeoff between channel resistance and parasitic capacitance has a pronounced impact.

FIG. 8 depicts an embodiment 50A of a third switched-capacitor circuit 50 that improves upon some of the characteristics discussed above in regard to the first and second switched-capacitor circuits 24, 44. As referred to herein, the third switched-capacitor circuit 50 includes embodiment 50A in FIG. 8, embodiment 50B in FIG. 10, embodiment 50C in FIG. 12 and embodiment 50D in FIG. 14. Aspects described herein as being generally of the third switched-capacitor circuit 50 (i.e., aspects not described as specifically pertaining to only a specific one of the embodiments 50A, 50B, 50C, 50D) are aspects of all of the embodiments 50A, 50B, 50C, 50D of FIGS. 8, 10, 12 and 14. The third switched-capacitor circuit 50 includes an input stage, having first and second switches S1, S2 and the input capacitor CIN arranged in a manner similar to the first and second switched-capacitor circuits 24, 44. The input capacitor CIN is connected to the inverting input terminal of a first amplifier A1 and to terminals of the first and second switches S1, S2. The first switch S1 is configured to receive the input voltage VIN at its other terminal, and is enabled during the enable phase 36 of the second clock signal φ2. The second switch S2 has its other terminal connected to ground, and is enabled during the enable phase 30 of the first clock signal φ1. Note that, in the embodiment 50A of FIG. 8, and in other embodiments of the third switched-capacitor circuit 50, any terminal of a component connected to ground can instead be connected to a predetermined substantially-DC reference voltage such as, e.g., a lower supply voltage available to the third switched-capacitor circuit 50.

The third switched-capacitor circuit 50 also includes a plurality of differential-input, single-ended-output amplifiers arranged in a cascade. Each of the amplifiers in the cascade, except for the last amplifier, has an output terminal connected to an input terminal of a next amplifier in the cascade. For example, the embodiment 50A depicted in FIG. 8 has two amplifiers, including the first amplifier A1 having a single output terminal and non-inverting (positive) and inverting (negative) input terminals, and a second amplifier A2, also having a single output terminal and non-inverting and inverting input terminals. The output terminal of the first amplifier A1 is connected to the non-inverting input terminal of the second amplifier A2. However, note that, although in the embodiment 50A of FIG. 8 the output terminal of the first amplifier A1 is connected to the non-inverting input of the second amplifier, in other embodiments of the third switched-capacitor circuit 50, the output terminals of amplifiers in the cascade can be connected to either the inverting or non-inverting input terminals of succeeding amplifiers in the cascade.

Further regarding the embodiment 50A of FIG. 8, the non-inverting input terminal of the first amplifier A1 is configured to receive a first common-mode voltage VCM1, and the inverting input terminal of the first amplifier A1 is connected to the feedback capacitor CFB. The non-inverting input terminal of the second amplifier A2 is connected to the output terminal of the first amplifier A1, and the inverting input terminal of the second amplifier A2 is configured to receive a second common-mode voltage VCM2. Note, however, that in other embodiments the inverting input terminal of the second amplifier A2 can alternatively be configured to receive the first common-mode voltage VCM1.

The third switched-capacitor circuit 50 also includes an overall feedback path, from the output terminal of the last amplifier in the cascade to one of the input terminals of the first amplifier in the cascade, that is part of a negative feedback loop, that does not include any switches, and that is configured to not be shorted out in its entirety by any switches, and that is configured to not include any devices therein that are shorted out by any switches. Because this overall feedback path does not include any switches, it does not suffer from the adverse effect on the frequency response of the non-zero impedance of presented by enabled switches during the enable phase 36 of the second clock signal φ2. In the embodiment of the third switched-capacitor circuit 50A depicted in FIG. 8, the overall feedback path includes the feedback capacitor CFB connected from the output terminal of the second amplifier A2 to the inverting input terminal of the first amplifier A1. Thus, the overall feedback path depicted in FIG. 8 does not include any switches (i.e., there are no switches that would need to be enabled during the enable phase 36 of the second clock signal φ2, contrary to the configuration of, e.g., the fourth switch SD in FIG. 6), nor is it ever shorted out or have devices that are shorted out (i.e., it is not shorted out by a switch during the enable phase 36 of the first clock signal φ1, contrary to the configuration of, e.g., the feedback switch SC in FIGS. 3 and 6). Note that, in the context of the overall feedback path not including any switches, such excluded switches can include transistor switch implementations and other switch implementations such as, e.g., passive diode-based switch implementations. Furthermore, a feedback loop traced from the output terminal of the second amplifier A2 (which is connected to the overall output terminal of the depicted third switched-capacitor circuit 50A that delivers the overall output voltage VOUT), through the overall feedback path having the feedback capacitor CFB, and forward again through the first and second amplifiers A1, A2, is a negative feedback loop.

The third switched-capacitor circuit 50 can also be configured to not include any switches in any feedback path that are enabled during the enable phase 36 of the second clock signal φ2. In such embodiments, the third switched-capacitor circuit 50 thus does not suffer from the adverse effect on frequency response of non-zero switch impedances in any feedback path during this enable phase 36. For example, the embodiment 50A of FIG. 8 does not include any switches in any feedback path that are enabled during the enable state 36 of the second clock signal φ2. The depicted embodiment of the third switched-capacitor circuit 50A includes a second feedback path from the output terminal of the first amplifier A1 to the inverting input terminal of the first amplifier A1, however this second feedback path, as with the overall feedback path, does not include any switches that are enabled during the enable phase 36 of the second clock signal φ2. Instead, the fourth switch S4 present in this second feedback path is enabled during the enable phase 30 of the first clock signal φ1. The second feedback path is also a negative feedback path.

In the third switched-capacitor circuit 50, the last amplifier in the cascade of amplifiers has a tri-state output terminal which is placed into a high-impedance state during the enable phase 30 of the first clock signal φ1 and enabled to drive an output voltage during the enable phase 36 of the second clock signal φ2. A tri-state output terminal is typically an output terminal that can assume any one of three output states, including a logic-high voltage state, a logic-low voltage state and a high impedance state. The logic-high and logic-low voltage values are typically the highest and lowest voltage values available in a circuit, such as the upper and lower supply voltages, respectively, or an upper supply voltage and ground, respectively. As used within the context of the switched-capacitor circuits discussed herein, the tri-state output terminal is further defined as being capable of assuming any voltage value in between the logic-high voltage value and the logic-low voltage value when it is enabled to drive an output voltage. In this manner, the tri-state output terminal can implement a discrete-time analog input-to-output transfer function. Thus, in the third switched-capacitor circuit 50, the tri-state output terminal of the last amplifier in the cascade of amplifiers is placed into a high impedance state, in which it does not contribute to determining a voltage of a circuit node to which it is connected (or in which, from another perspective, it is substantially not capable of conducting a current) during the enable phase 30 of the first clock signal φ1; and is enabled to drive the voltage of the circuit node to which it is connected (and thus this voltage is a function of a signal being amplified by the amplifier) (or in which, from another perspective, it is capable of conducting a current) during the enable phase 36 of the second clock signal φ2.

In the embodiment 50A of FIG. 8, the second amplifier A2 has an enable terminal configured to receive a first enable signal EN1(φ2) that enables the tri-state output terminal to drive a voltage at its node during the enable phase 36 of the second clock signal φ2 and places the output terminal in a high-impedance state during the enable phase 30 of the first clock signal φ1. That is, from another perspective, the output terminal of the second amplifier A2, as a result of the received first enable signal EN1(φ2), is capable of conducting a current during the enable phase 36 of the second clock signal φ2, and substantially not capable of conducting a current during the enable phase 30 of the first clock signal φ1.

The third switched-capacitor circuit 50 also includes a third switch S3 having a terminal connected to the feedback capacitor CFB and the output terminal of the last amplifier in the cascade (e.g., the second amplifier A2 in the embodiment 50A of FIG. 8), and another terminal configured to receive a substantially-DC reference voltage VREF. The third switch S3 is enabled during the enable phase 30 of the first clock signal φ1. Also, note that the action of the third switch S3 is not considered, within the context of the description herein, to either short out the entirety of the overall feedback path from the output terminal of the last amplifier (e.g., A2) to the input terminal of the first amplifier A1, or to short out any device contained in the overall feedback path. Instead, when the third switch S3 is enabled during the enable phase 30 of the first clock signal φ1, it connects one end of the overall feedback path (i.e., the end connected to the terminal of the feedback capacitor CFB and the output terminal of the last amplifier) to the reference voltage VREF. However, neither the overall feedback path, nor any device therein, is shorted out by this connection.

FIGS. 9A and 9B depict circuit configurations 54, 58, assuming ideal switches, resulting from the embodiment of the third switched-capacitor circuit 50A of FIG. 8 during the enable phase 30 of the first clock signal φ1 and the enable phase 36 of the second clock signal φ2, respectively. The third switched-capacitor circuit 50 can be used, e.g., as a switched-capacitor gain stage, and an input-to-output transfer function of the embodiment 50A of FIG. 8 can be derived using a discrete-time charge-conservation analysis. This transfer function can be represented by the following: VOUT=VREF−(CIN/CFB)*VIN. Thus, the third switched-capacitor circuit 50 achieves an input-to-output transfer function having an DC offset that is substantially not a function of the input-referred offset voltage VOFF of the first amplifier A1, due to the third switched-capacitor circuit 50 being configured so that this input-referred offset voltage VOFF is sampled onto both the feedback capacitor CFB and input capacitor CIN during the enable phase 30 of the first clock signal φ1, and thus cancelled out of the transfer function. Furthermore, due to the connection of the feedback capacitor CFB to the reference voltage VREF during the enable phase 30 of the first clock signal φ1, the output voltage VOUT has an adjustable DC offset that is a function of the reference voltage VREF, which can have a selected predetermined value.

As depicted in FIG. 9A, a potential additional benefit of the third switched-capacitor circuit 50 is that the output voltage VOUT can assume the value of the reference voltage VREF during the enable phase 30 of the first clocking signal φ1. Although in many switched-capacitor circuits, including those discussed herein, the output voltage can be considered as not yet validly available during the enable phase 30 of the first clock signal φ1, it can nonetheless still be advantageous in certain applications to control what value the output voltage does have during this enable phase 30 of the first clock signal φ1. As the reference voltage VREF can have a selected predetermined value, this value can thus optionally be selected to be a value that advantageously determines the output voltage VOUT of the third switched-capacitor circuit 50 during the enable phase 30 of the first clock signal φ1, e.g., for purposes of some particular application.

Figure 10:
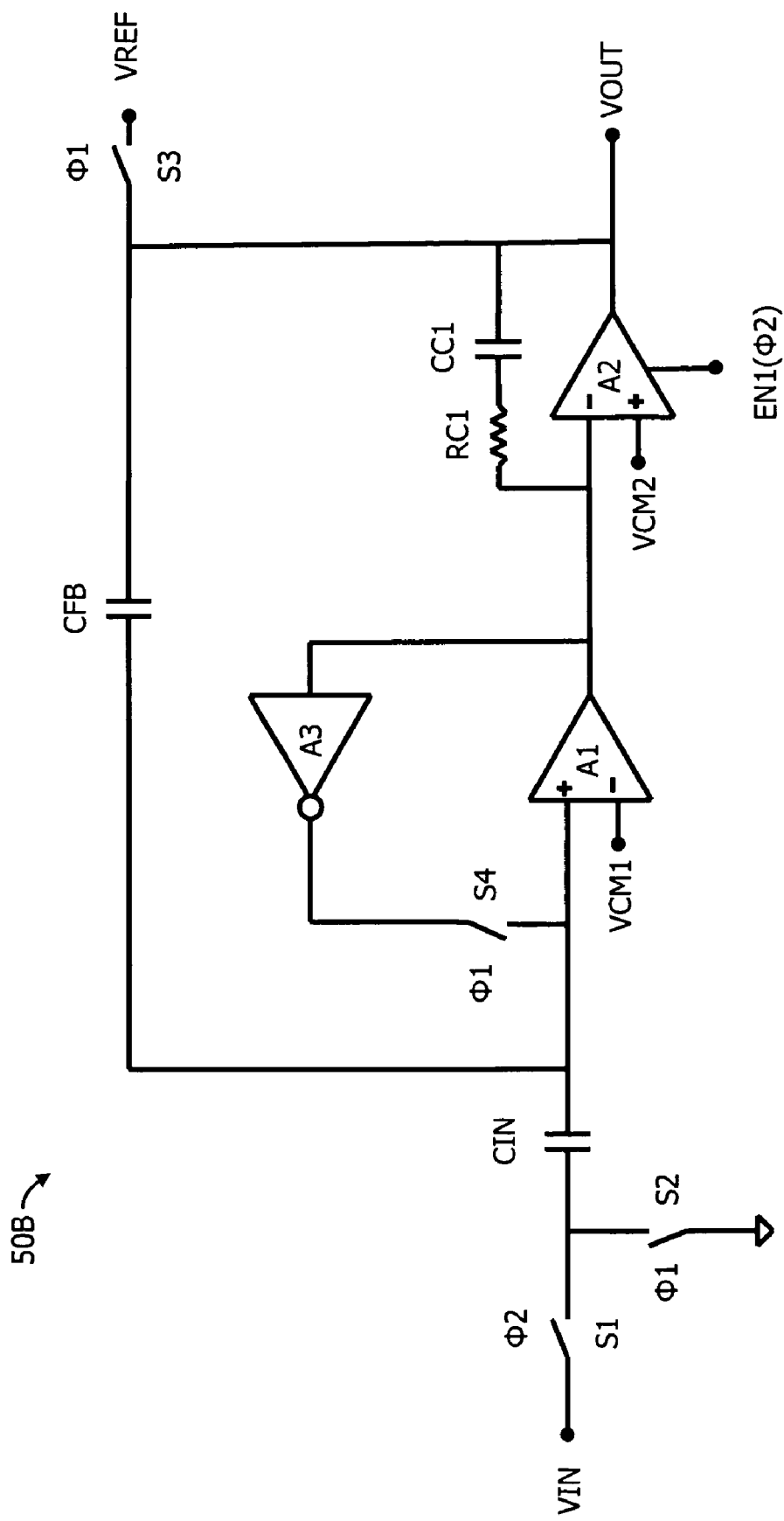
FIG. 10 is a circuit schematic depicting another embodiment of the third switched-capacitor circuit.

FIG. 10 depicts another embodiment 50B of the third switched-capacitor circuit 50. The embodiment 50B of FIG. 10 is configured similarly to the embodiment 50A of FIG. 8, with differences including the following. The first amplifier A1 now has the input stage (including the input capacitor CIN) and the overall feedback path (including the feedback capacitor CFB) connected to its non-inverting input terminal (instead of the inverting input terminal as in FIG. 8), and its output terminal connected to the inverting input terminal of the second amplifier A2 (instead of the non-inverting terminal as in FIG. 8). Also, the second feedback path is now from the output terminal of the first amplifier A1 to the non-inverting input terminal (instead of the inverting input terminal) of the first amplifier A1, and includes a third amplifier A3, having a single input terminal and a single output terminal. As depicted by the corresponding symbol in FIG. 10, the third amplifier A3 is an inverting amplifier. The input terminal of the third amplifier A3 is connected to the output terminal of the first amplifier A1, and the output terminal of the third amplifier A3 is connected to the fourth switch S4. In the embodiment 50B of FIG. 10, there is now also a third feedback path connected from the output terminal of the second amplifier A2 to the negative input terminal of the second amplifier A2. The third feedback path is a negative feedback path and includes a first compensation network having a first compensation capacitor CC1 and a first compensation resistor RC1. Note that, as with the embodiment 50A of FIG. 8, the first and second common-mode voltages VCM1, VCM2 can be the same voltage.

Figure 11A:
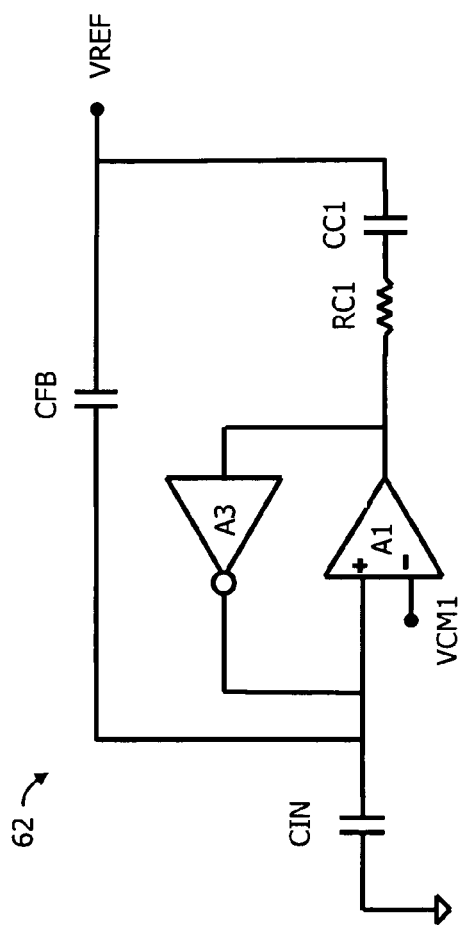
FIG. 11A is a circuit schematic depicting an embodiment of a circuit configuration resulting from the embodiment of the third switched-capacitor circuit depicted in FIG. 10 during the enable phase of the first clock signal.
Figure 11B:
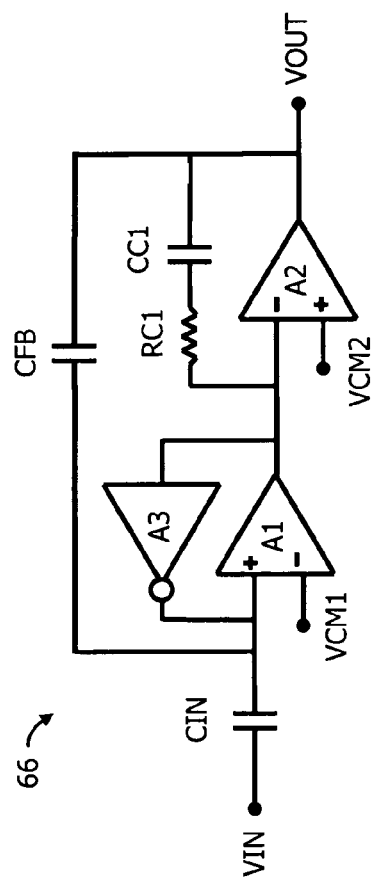
FIG. 11B is a circuit schematic depicting an embodiment of a circuit configuration resulting from the embodiment of the third switched-capacitor circuit depicted in FIG. 10 during the enable phase of the second clock signal.

FIGS. 11A and 11B depict circuit configurations 62, 66, assuming ideal switches, resulting from the embodiment 50B of the third switched-capacitor circuit 50 of FIG. 10 during the enable phase 30 of the first clock signal φ1 and the enable phase 36 of the second clock signal φ2, respectively. An input-to-output transfer function of the embodiment 50B of the third switched-capacitor circuit 50 depicted in FIG. 10 can be derived using a discrete-time charge-conservation analysis, and can be represented by the same transfer function as discussed above for the embodiment 50A of FIG. 8, i.e., as follows: VOUT=VREF−(CIN/CFB)*VIN.

Figure 12:
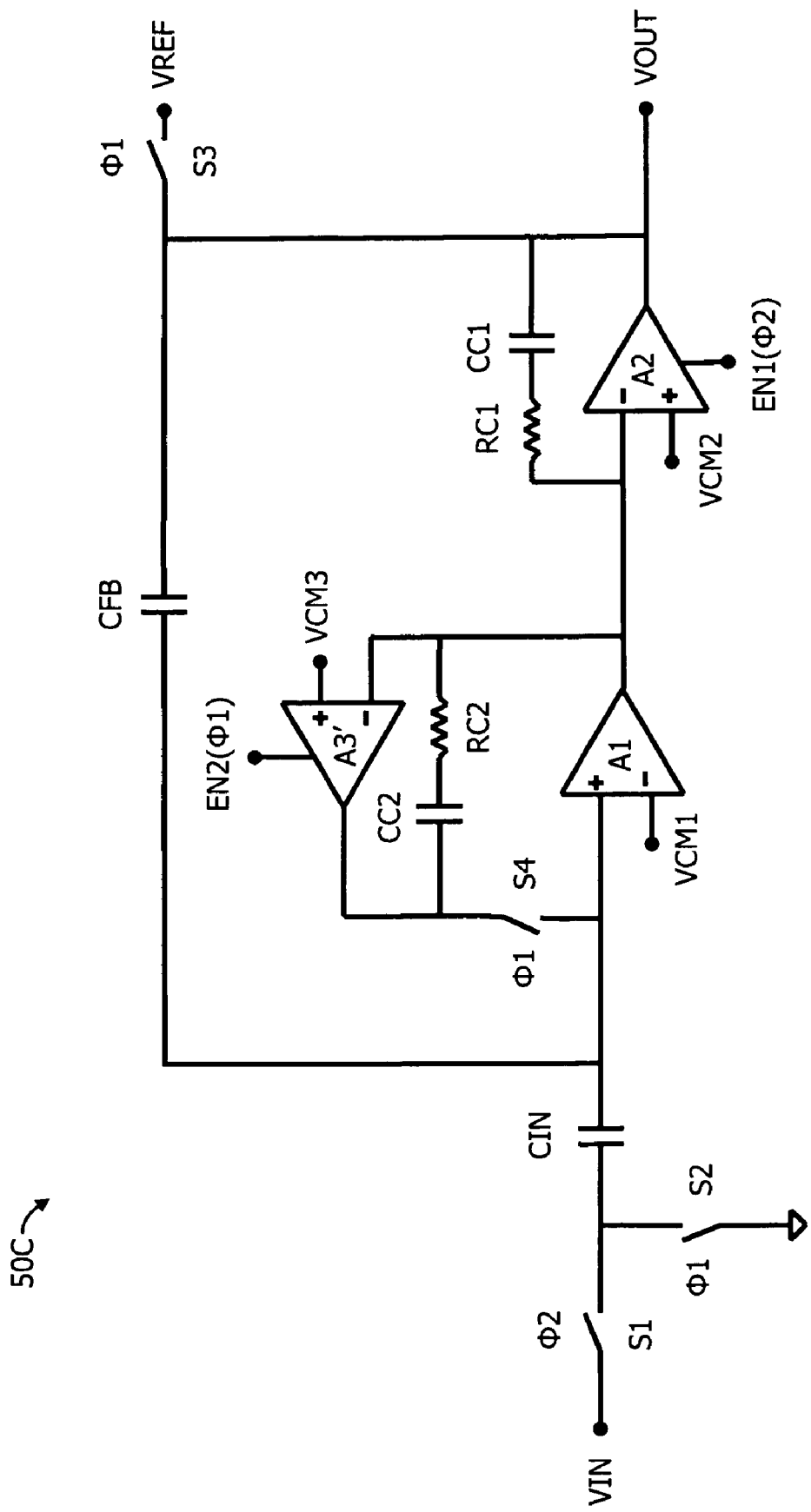
FIG. 12 is a circuit schematic depicting another embodiment of the third switched-capacitor circuit.

FIG. 12 depicts another embodiment 50C of the third switched-capacitor circuit 50. The embodiment 50C of FIG. 12 is configured similarly to the embodiment 50B of FIG. 10, with some differences including the following. The depicted embodiment 50C includes an embodiment of the third amplifier A3' that has differential input terminals (instead of a single input terminal), including an inverting input terminal connected to the output terminal of the first amplifier A1, and a non-inverting input terminal configured to receive a third common-mode voltage VCM3. The depicted embodiment of the third amplifier A3' also has a tri-state output terminal, in a similar manner as discussed above in regard to the second amplifier A2, and an enable terminal configured to receive a second enable signal EN2(φ1) that places the tri-state output terminal in the high impedance state during the enable phase 36 of the second clock signal φ2 and in the output-voltage-driving state during the enable phase 30 of the first clock signal φ1. The depicted configuration of the third amplifier A3' to be drive-enabled only during the enable state 30 of the first clock signal φ1 advantageously conserves power. Also, the second feedback path now includes a second compensation network connected between the output terminal of the first amplifier A1 and the circuit node connected to the output terminal of the depicted third amplifier A3' and fourth switch S4. The second compensation network includes a second compensation capacitor CC2 and a second compensation resistor RC2. Note that, similar to the embodiments 50A, 50B of FIGS. 8 and 10, the first, second and third common-mode voltages VCM1, VCM2, VCM3 can be the same voltage.

FIGS. 13A and 13B depict circuit configurations 70, 74, assuming ideal switches, resulting from the embodiment 50C of the third switched-capacitor circuit 50 of FIG. 12 during the enable phase 30 of the first clock signal φ1 and the enable phase 36 of the second clock signal φ2, respectively. An input-to-output transfer function of the depicted embodiment 50C can be derived using a discrete-time charge-conservation analysis, and can be represented by the same transfer function as discussed above for the embodiments 50A, 50B of FIGS. 8 and 10, as follows: VOUT=VREF−(CIN/CFB)*VIN.

Figure 14:
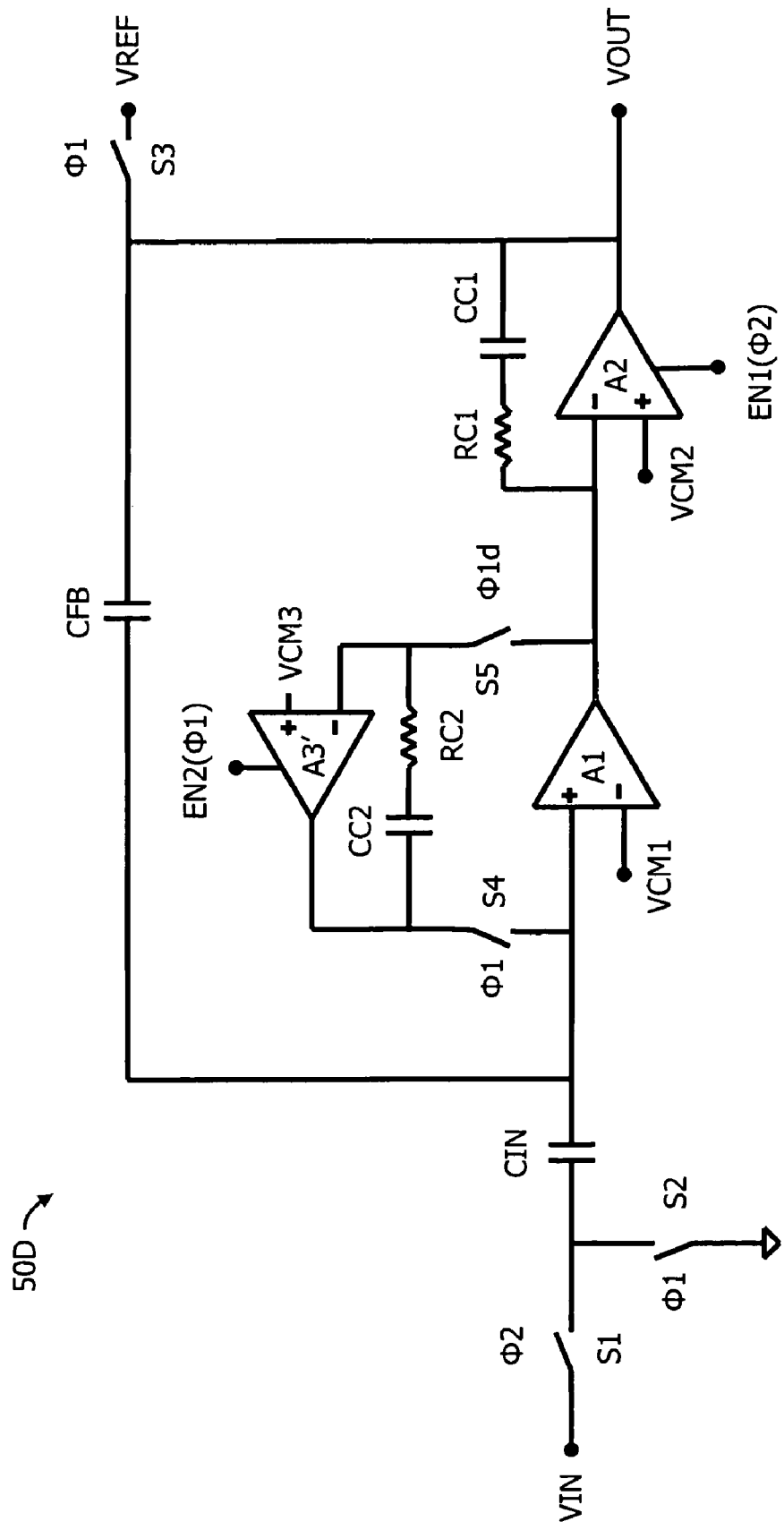
FIG. 14 is a circuit schematic depicting another embodiment of the third switched-capacitor circuit.

FIG. 14 depicts another embodiment 50D of the third switched-capacitor circuit 50. The embodiment 50D of FIG. 14 is configured similarly to the embodiment 50C of FIG. 12, with the following differences. The second feedback path now includes a fifth switch S5 connected between the output terminal of the first amplifier A1 and the circuit node connected to the negative input terminal of the differential-input embodiment of the third amplifier A3' and the second compensation network. The fifth switch S5 is enabled during an enable phase 86 of a delayed version of the first clock signal φ1d (shown in FIG. 15). Such enabling of the fifth switch S5 according to the delayed first clock signal φ1d may minimize any adverse effect of charge injection involving the fifth switching device S5.

Circuit configurations 70, 74, assuming ideal switches, resulting from the embodiment 50D of FIG. 14 during the enable phase 30 of the first clock signal φ1 and the enable phase 36 of the second clock signal φ2 are again depicted by FIGS. 13A and 13B, respectively. An input-to-output transfer function of the embodiment 50D of FIG. 14 can be derived using a discrete-time charge-conservation analysis, and can be represented by the same transfer function as discussed above for the embodiments 50A, 50B, 50C of FIGS. 8, 10 and 12, as follows: VOUT=VREF−(CIN/CFB)*VIN.

Figure 15:
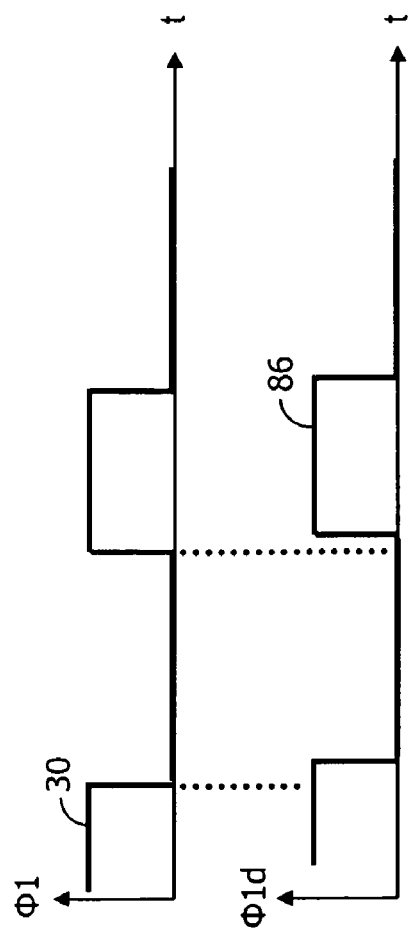
FIG. 15 depicts embodiments of the first clock signal and a delayed first clock signal.

FIG. 15 depicts embodiments of the first clock signal φ1d and the delayed first clock signal φ1d. As depicted, the delayed first clock signal φ1d transitions from its enable state to its non-enable state, and back again, at delayed times relative to the same transitions in the first clock signal φ1.

Figure 17:
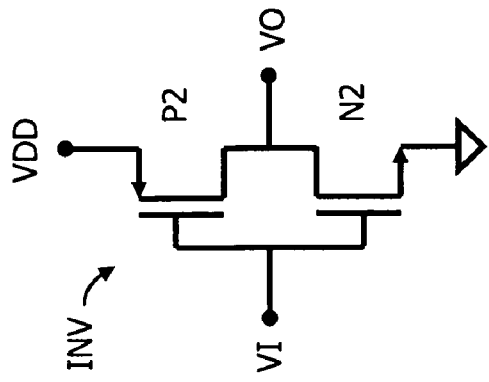
FIG. 17 is a circuit schematic depicting an embodiment of an inverter of the delay circuit depicted in FIG. 16.
Figure 16:
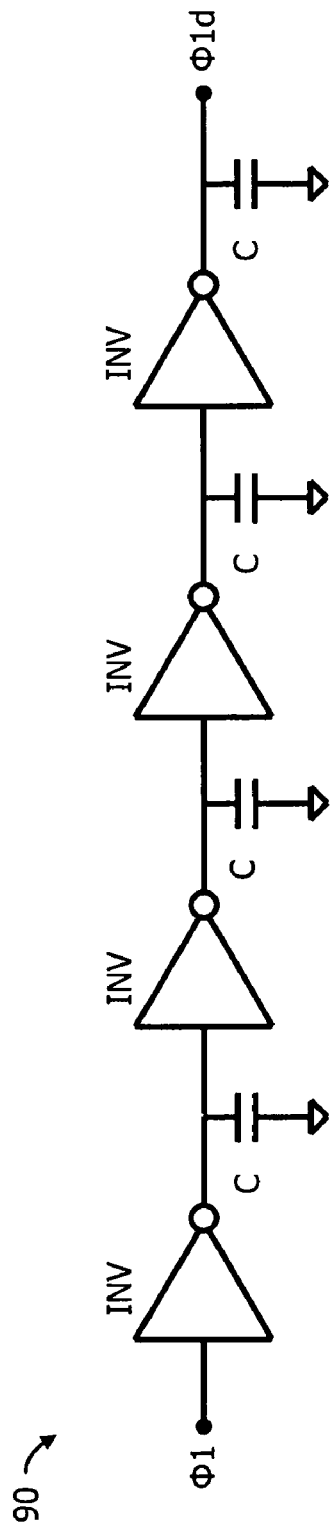
FIG. 16 is a circuit schematic depicting an embodiment of a delay circuit configured to produce the delayed first clock signal.

FIG. 16 depicts an embodiment of a delay circuit 90 that can be used to generate the delayed first clock signal φ1d from the first clock signal φ1. The depicted delay circuit includes a cascade of a plurality of inverters INV and capacitances C. An input terminal of the first inverter INV in the cascade of inverters INV is configured to receive the first clock signal φ1, and an output terminal of the last inverter INV in the cascade of inverters INV provides the delayed first clock signal φ1d. The number of the plurality of inverters INV and capacitances C in the cascade can be selected to control the amount of delay of the delayed first clock signal φ1d relative to the first clock signal φ1. FIG. 17 depicts an embodiment of the inverter INV having an NMOS transistor N2 and PMOS transistor P2, receiving an input voltage VI at an input terminal, generating an output voltage VO at an output terminal, and also receiving an upper supply voltage VDD and ground.

Figure 18:
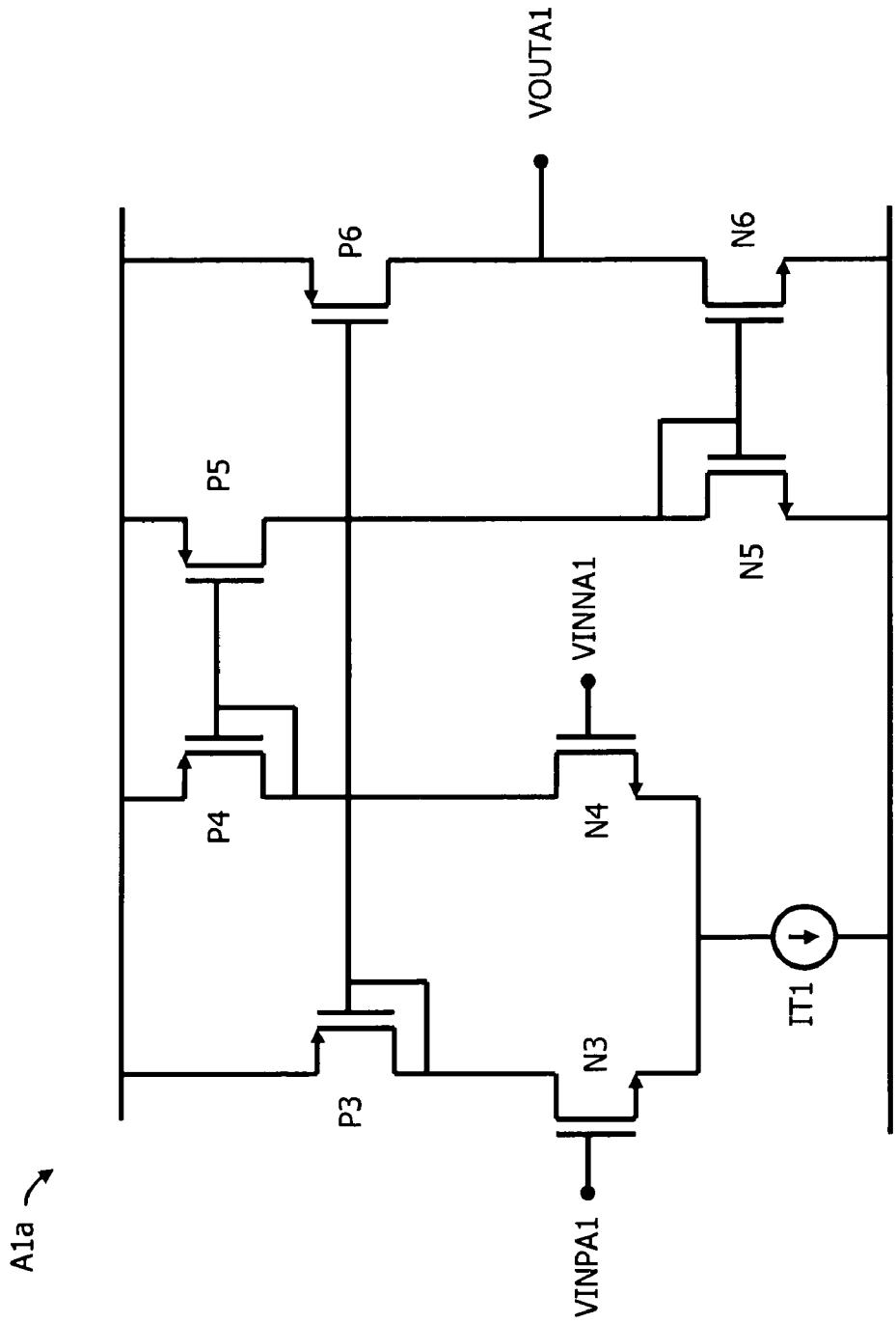
FIG. 18 is a circuit schematic depicting an embodiment of a first amplifier of the third switched-capacitor circuit.

FIG. 18 depicts an embodiment A1a of the first amplifier A1 of the third switched-capacitor circuit 50. The depicted embodiment A1a includes a differential-input pair of NMOS transistors N3, N4 (configured to receive non-inverting and inverting input-terminal voltages VINPA1 and VINNA1), supplied with a tail current by current source IT1 and connected to active-load PMOS transistors P3, P4; and differential-to-single-ended output-stage NMOS and PMOS transistors N5, N6, P5, P6 producing output voltage VOUTA1 at the output terminal.

Figure 19:
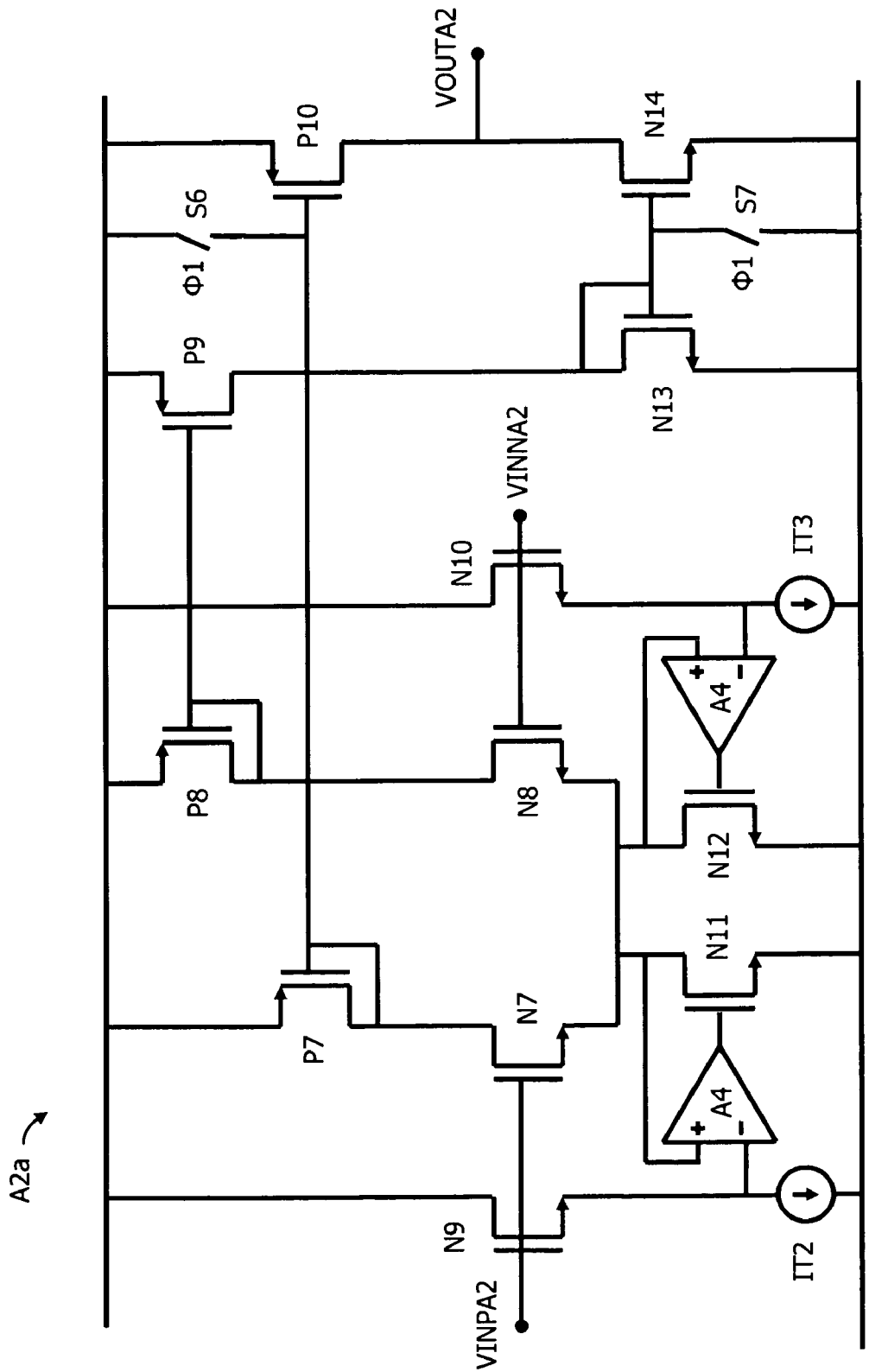
FIG. 19 is a circuit schematic depicting an embodiment of a second amplifier of the third switched-capacitor circuit.

FIG. 19 depicts an embodiment A2a of the second amplifier A2 of the third switched-capacitor circuit 50. The depicted embodiment A2a includes a differential-input pair of NMOS transistors N7, N8 (configured to receive non-inverting and inverting input-terminal voltages VINPA2 and VINNA2), supplied with a class-AB tail current by a current source including NMOS transistors N11, N12, a pair of feedback amplifiers A4, current sources IT2 and IT3, and parallel input NMOS transistors N9, N10, and connected to active-load PMOS transistors P7, P8. The depicted embodiment A2a also includes differential-to-single-ended output-stage NMOS and PMOS transistors N13, N14, P9, P10 producing output voltage VOUTA2 at the output terminal. The depicted embodiment A2a also includes a pair of switches S6, S7, configured to implement the tri-state output terminal and enable terminal of the second amplifier A2, which are enabled during the enable phase 30 of the first clock signal φ1.

FIGS. 20A, 20B and 20C depict additional embodiments 94, 96, 100 of transistor-based switch implementations suitable for implementing the switches of the switched-capacitor circuits discussed herein. The embodiment 94 of FIG. 20A includes PMOS transistors, and can be suitable, e.g., for passing low voltages. The embodiment 96 of FIG. 20B includes NMOS transistors, and can be suitable, e.g., for passing high voltages. The embodiment 100 of FIG. 20C includes both NMOS and PMOS transistors, and can be suitable, e.g., for passing signals that swing rail-to-rail. All three depicted embodiments 94, 96, 100 include dummy devices Pd, Nd to soak up excess channel charge and decrease the effects of charge injection.

Figures 21A, 21B:
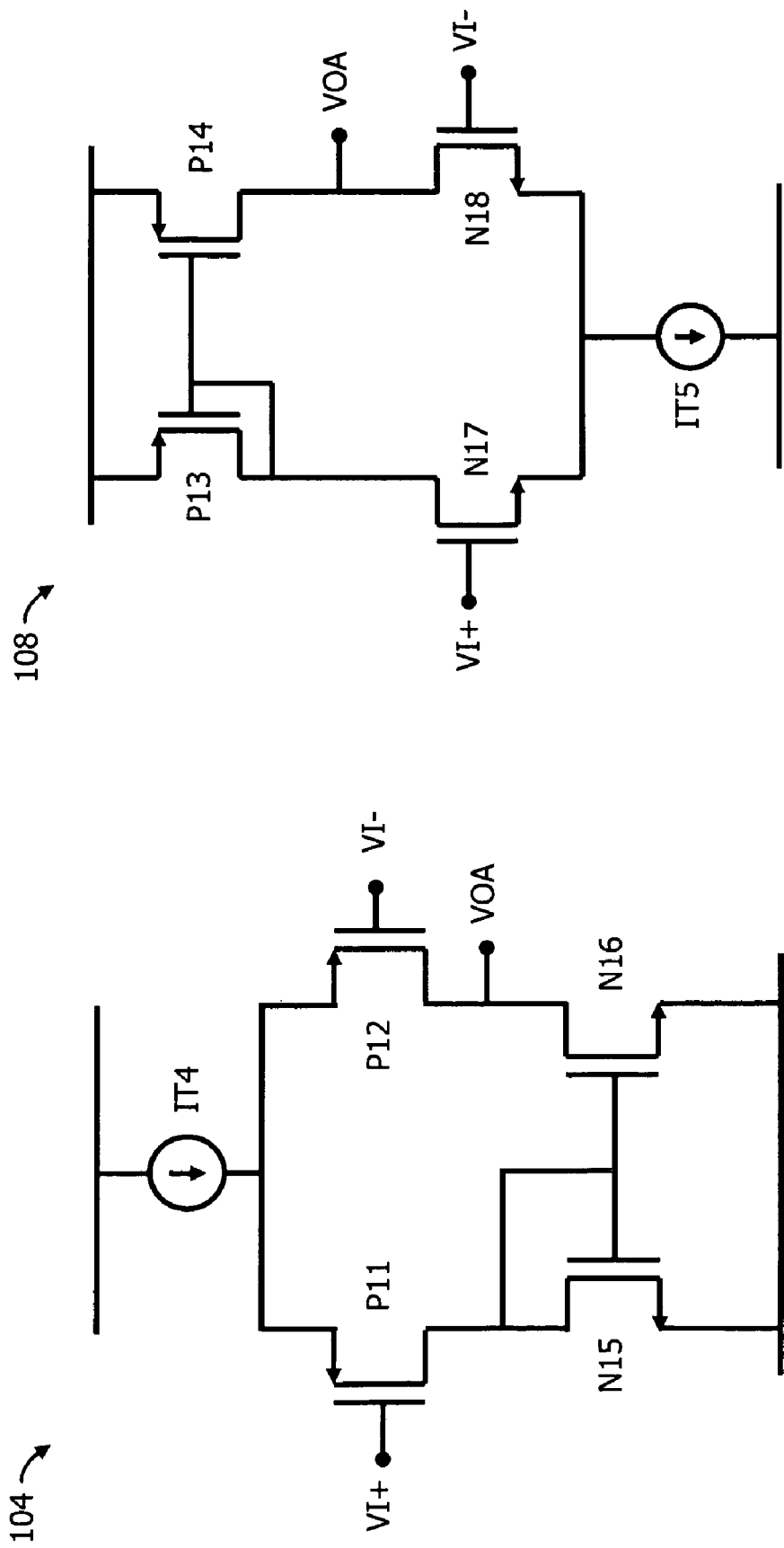
FIG. 21A is a circuit schematic depicting an embodiment of a third amplifier of the third switched-capacitor circuit.
FIG. 21B is a circuit schematic depicting another embodiment of the third amplifier of the third switched-capacitor circuit.

FIGS. 21A and 21B depicts embodiments 104, 108 of amplifiers, either of which can be used to implement embodiments of the third amplifier A3, A3'. The embodiment 104 of FIG. 21A includes PMOS differential-pair transistors P11, P12, active load NMOS transistors N15, N16, and tail-current source IT4, and is configured to receive differential input voltages VI+, VI− and produce a single output voltage VOA. The embodiment 108 of FIG. 21B includes NMOS differential-pair transistors N17, N18, active load PMOS transistors P13, P14, and tail-current source IT5, and is configured to receive differential input voltages VI+, VI− and produce a single output voltage VOA. For embodiments of the third amplifier A3 having a single input terminal, one of the gates of the differential input transistors of the embodiments 104, 108 depicted in FIGS. 21A and 21B can be tied to a fixed DC voltage. Also, for embodiments of the third amplifier A3' configured to receive an enable signal, the enable functionality, and thus effectively the tri-state output terminal, can be implemented by turning on or turning off the tail current sources IT4, IT5 according to the enable signal.

In other embodiments, the amplifiers 104, 108 depicted in FIGS. 21A and 21B can also be used to implement embodiments of the first and second amplifiers A1, A2 of the third switched-capacitor circuit 50. Other amplifiers can also be used to implement embodiments of any of the amplifiers of the third switched-capacitor circuit 50.

FIG. 22 is a flow chart depicting an embodiment of a method 200. In a first step 202, the method 200 includes cascading a plurality of the differential-input, single-ended-output amplifiers (e.g., the first amplifier A1 and the second amplifier A2) to form the third switched-capacitor circuit 50. In a second step 204, the method 200 includes connecting the overall negative feedback path from the output terminal of the last (e.g., the second amplifier A2) of the cascaded amplifiers to the input terminal of the first (e.g., the first amplifier A1) of the cascaded amplifiers, wherein the feedback path excludes, and is configured to not be shorted out by, any switches.

Further embodiments are also possible, which are the result of variously combining elements or embodiments described herein.

What is claimed is:

1. A switched-capacitor circuit, comprising:
   a plurality of cascaded differential-input, single-ended-output amplifiers;
   a negative feedback path from an output terminal of a last of the cascaded amplifiers to an input terminal of a first of the cascaded amplifiers, wherein the feedback path is configured to exclude, and not be shorted out by, any switches,
   wherein the switched-capacitor circuit is configured to receive first and second clock signals, an enable phase of the first clock signal not temporally overlapping an enable phase of the second clock signal.

2. The switched-capacitor circuit of claim 1, wherein the feedback path does not include any switches that are configured to be enabled during the enable phase of the first clock signal, the feedback path does not include any switches that are configured to be enabled during the enable phase of the second clock signal, the switched-capacitor circuit does not include any switches that are configured to short out the feedback path during the enable phase of the first clock signal, and the switched-capacitor circuit does not include any switches that are configured to short out the feedback path during the enable phase of the second clock signal.

3. The switched-capacitor circuit of claim 1, wherein the feedback path includes a feedback capacitor connected from the output terminal of the last of the cascaded amplifiers to the input terminal of the first of the cascaded amplifiers.

4. The switched-capacitor circuit of claim 1, further comprising a feedback capacitor and an input capacitor, wherein the switched-capacitor circuit is configured so that an input-referred offset voltage of the first amplifier is sampled onto both the feedback capacitor and the input capacitor during the enable phase of the first clock signal.

5. The switched-capacitor circuit of claim 1, wherein the last of the cascaded amplifiers is configured to receive an enable signal, and, as a function of the received enable signal, the output terminal of the last of the cascaded amplifiers is enabled to drive an output voltage during the enable phase of the second clock signal, and placed into a high-impedance state during the enable phase of the first clock signal.

6. The switched-capacitor circuit of claim 1, wherein each of the cascaded amplifiers, except for the last amplifier, has an output terminal connected to an input terminal of a next of the cascaded amplifiers.

7. A switched-capacitor circuit, comprising:
a plurality of cascaded differential-input, single-ended-output amplifiers;
a negative feedback path from an output terminal of a last of the cascaded amplifiers to an input terminal of a first of the cascaded amplifiers, wherein the feedback path is configured to exclude, and not be shorted out by, any switches, and wherein the switched-capacitor circuit is configured to generate an output voltage as a function of an input voltage, wherein the output voltage is substantially not a function of an input-referred offset voltage of the first of the cascaded amplifiers.

8. The switched-capacitor circuit of claim 7, wherein the output voltage is not a function of a common-mode voltage received at any input terminal of any of the plurality of cascaded amplifiers.

9. The switched-capacitor circuit of claim 7, wherein the output voltage is the function of the input voltage during the enable phase of the second clock signal, and the output voltage is substantially equal to a selectable predetermined reference voltage during the enable phase of the first clock signal, wherein the selectable predetermined reference voltage can be a voltage other than any common-mode voltage received at any input terminal of any of the cascaded amplifiers.

10. A switched-capacitor circuit configured to receive first and second clock signals having non-overlapping enable phases, the switched-capacitor circuit comprising:
a first amplifier having an output terminal and differential input terminals;
a second amplifier having an output terminal and differential input terminals, wherein the output terminal of the first amplifier is connected to one of the differential input terminals of the second amplifier;
a feedback capacitor having a first terminal connected to the output terminal of the second amplifier and a second terminal connected to one of the differential input terminals of the first amplifier, wherein the switched-capacitor circuit is configured to not short out the feedback capacitor.

11. The switched-capacitor circuit of claim 10, wherein the second amplifier has a tri-state output terminal that is configured to be enabled to conduct current during the enable phase of the second clock signal and substantially not capable of conducting current during the enable phase of the first clock signal, wherein the tri-state output terminal is configured to be in a high-impedance state during the enable phase of the first clock signal.

12. The switched-capacitor circuit of claim 10, further comprising a switch having one terminal connected to the feedback capacitor and another terminal configured to receive a substantially-DC reference voltage, the switch configured to be enabled only during the enable phase of the first clock signal.

13. The switched-capacitor circuit of claim 10, further comprising an input capacitor connected to an input terminal of the first amplifier and a pair of input switches, including a first switch configured to receive an input voltage and be enabled only during the enable phase of the second clock signal, and a second switch configured to receive at least one of: a lower supply voltage, or ground.

14. The switched-capacitor circuit of claim 10, further comprising a negative feedback path from the output terminal of the first amplifier to an input terminal of the first amplifier, the feedback path including a switch, the switch configured to be enabled only during the enable phase of the first clock signal.

15. The switched-capacitor circuit of claim 14, wherein the feedback path includes a third amplifier having a single input terminal and a single output terminal, the single input terminal connected to the output terminal of the first amplifier, and the single output terminal connected to the switch.

16. The switched-capacitor circuit of claim 14, wherein the feedback path includes a third amplifier having inverting and non-inverting input terminals and a single output terminal, the inverting input terminal connected to the output terminal of the first amplifier, the output terminal of the third amplifier connected to the switch and configured to be enabled to conduct current in the enable phase of the first clock signal and substantially not enabled to conduct current during the enable phase of the second clock signal.

17. The switched-capacitor circuit of claim 16, wherein the feedback path includes a second feedback-path switch connected between the output terminal of the first amplifier and the inverting input terminal of the third amplifier, the second feedback-path switch configured to be enabled only during the enable phase of a delayed version of the first clock signal.

18. A method, comprising:
cascading a plurality of differential-input, single-ended-output amplifiers to form a switched-capacitor circuit;
connecting a negative feedback path from an output terminal of a last of the cascaded amplifiers to an input terminal of a first of the cascaded amplifiers, wherein the feedback path excludes, and is configured to not be shorted out by, any switches; and
providing first and second clock signals to switches of the switched-capacitor circuit, wherein an enable phase of the first clock signal does not temporally overlap an enable phase of the second clock signal.

19. The method of claim 18, wherein the feedback path does not include any switches that are configured to be enabled during the enable phase of the first clock signal, the feedback path does not include any switches that are configured to be enabled during the enable phase of the second clock signal, the switched-capacitor circuit does not include any switches that are configured to short out the feedback path during the enable phase of the first clock signal, and the switched-capacitor circuit does not include any switches that are configured to short out the feedback path during the enable phase of the second clock signal.

* * * * *